United States Patent [19]

Mandelman et al.

[11] Patent Number: 5,547,894
[45] Date of Patent: Aug. 20, 1996

[54] CMOS PROCESSING WITH LOW AND HIGH-CURRENT FETS

[75] Inventors: Jack A. Mandelman, Stormville, N.Y.; Duane Galbi, Marlborough, Mass.; James A. Slinkman, Montpelier; William R. Tonti, Essex Junction, both of Vt.

[73] Assignee: International Business Machines Corporation, Armonk, N.Y.

[21] Appl. No.: 576,184

[22] Filed: Dec. 21, 1995

[51] Int. Cl.⁶ .................................................. H01L 21/8238
[52] U.S. Cl. .............................. 437/56; 437/34; 437/57
[58] Field of Search ......................... 437/56, 57, 58, 437/34, 59, 152; 148/DIG. 53, DIG. 9

[56] References Cited

U.S. PATENT DOCUMENTS

| | | | |
|---|---|---|---|
| 4,929,565 | 5/1990 | Parrillo | 437/34 |
| 4,968,639 | 11/1990 | Bergonzoni | 437/57 |
| 5,047,358 | 9/1991 | Kosiak et al. | 437/57 |
| 5,141,890 | 8/1992 | Haken | 437/44 |
| 5,252,501 | 10/1993 | Moslehi | 437/34 |
| 5,254,487 | 10/1993 | Tamagawa | 437/34 |
| 5,432,114 | 7/1995 | O | 437/56 |
| 5,468,666 | 11/1995 | Chapman | 437/56 |
| 5,498,554 | 3/1996 | Mei | 437/57 |
| 5,500,392 | 3/1996 | Reynolds et al. | 437/34 |

*Primary Examiner*—Charles L. Bowers, Jr.
*Assistant Examiner*—Michael Trinh

[57] ABSTRACT

A method of processing CMOS circuits provides up to three types of transistors (standard NFETs, PFETs and high current NFETs) without additional masking steps by the simultaneous implantation of the standard PFET and the high current NFET low doped source and drain implants and a separate implantation of the standard NFET.

6 Claims, 4 Drawing Sheets

CMOS PROCESSING WITH LOW AND HIGH-CURRENT FETS

FIELD OF THE INVENTION

The field of the invention is that of submicron CMOS semiconductor processing, in particular the provision of standard and high current FETs in the same circuit.

BACKGROUND ART

It is known to provide two types of N-FETs, low and high current, and/or two corresponding types of P-FETs, at the cost of additional masking and implant steps to get the different thresholds and current drive associated with the two types. The art has always sought process simplification to achieve lower manufacturing cost. The benefits of two types of transistors at reduced cost have long been sought.

SUMMARY OF THE INVENTION

The invention relates to a method of processing CMOS circuits that provides an additional type of transistor without additional masking steps.

A feature of the invention is the simultaneous implantation of the standard N-FET and P-FET low doped source and drain implants to form both standard and high performance NFETs.

BEST MODE OF CARRYING OUT THE INVENTION

Figure 1:
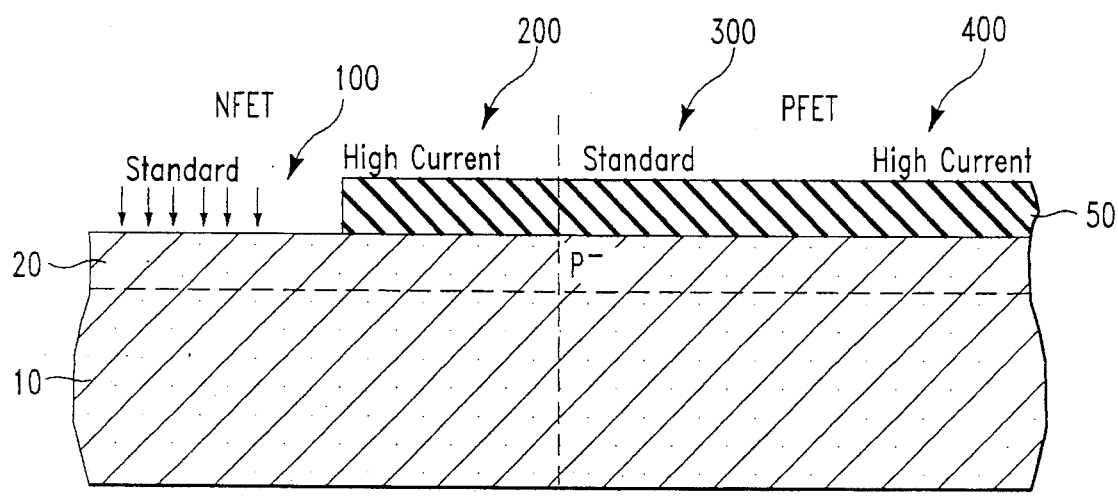
FIGS. 1 through 4 illustrate a portion of an integrated circuit at various steps in the processing sequence.

Referring to FIG. 1, there is shown in partially pictorial, partially schematic form, a portion of a wafer 10 having a device layer 20 doped P$^-$ with a conventional dopant concentration of $1 \times 10^{16}/cm^3$. Conventional notation is used in which a superscript– means a concentration on the order of $10^{16}/cm^3$ and a superscript+ means a concentration on the order of $10^{19}$–$10^{20}/cm^3$. A "P" or "N" without a superscript, such as in describing a well, conventionally means a dopant concentration of $\approx 2.5 \times 10^{17}/cm^3$–$5 \times 10^{17}/cm^3$ This figure illustrates the implantation step for the P-well of a standard N-FET on the left of the figure, denoted generally with the numeral 100. The remainder of the area shown is blocked by conventional photoresist implant blocking layer 50 covering the areas denoted with the numerals 200, 300 that will be the high current N-FET and the standard P-FET, respectively. The area at the far right of the Figure, denoted with the numeral 400 is the site of a high-current PFET that may be made with an alternative embodiment of the invention and will be described later. As can be seen in the figure, the high current N-FET does not receive the conventional P-well implant. Preliminary conventional steps such as blanket threshold adjustment implants and the like will be referred to for convenience as preparing the substrate and will not be shown.

Figure 2:
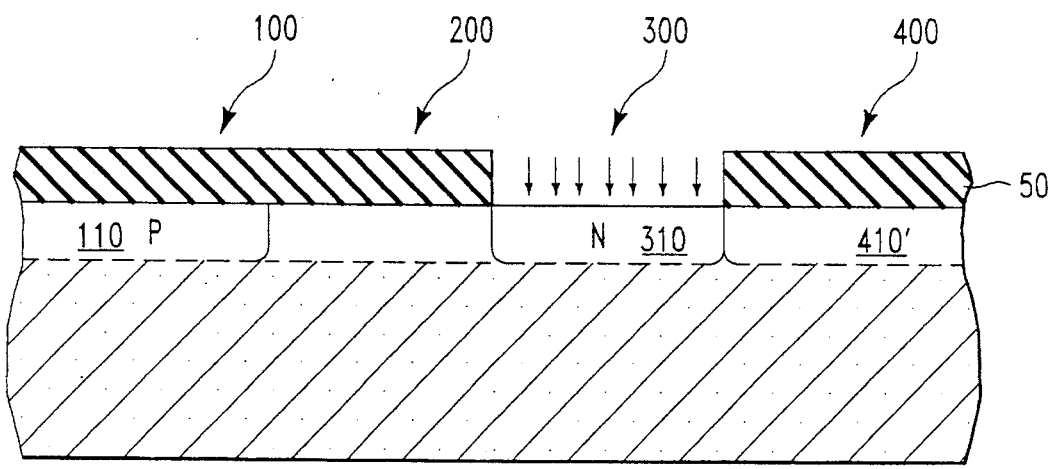

Referring now to FIG. 2, there is shown a corresponding figure denoting the implantation of the N-well for the standard P-FET. The implantation doses are for a conventional process, and are about $5.5 \times 10^{12}/cm^2$ @10 KeV ($V_t$ control), $6.0 \times 10^{12}/cm^2$ @130 KeV (Punch through) and $2 \times 10^{13}/cm^2$ @260 KeV (Latchup) for the standard NFET for a wafer having an initial boron dopant concentration of $1 \times 10^{16}/cm^3$. All three implants are omitted for the high performance NFET.

Figure 3:
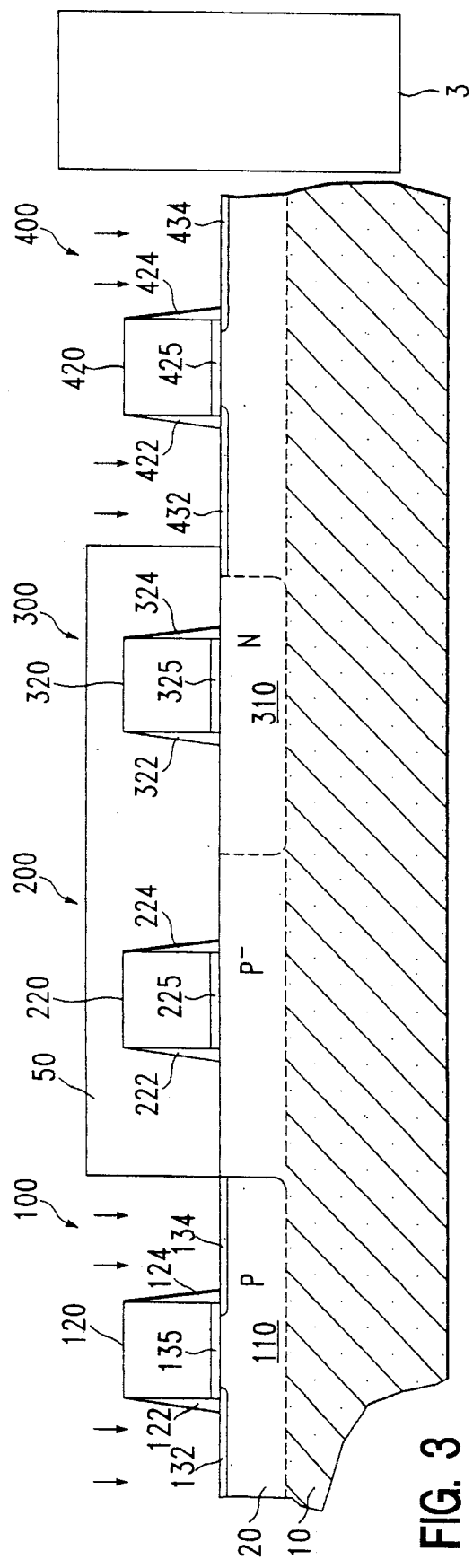

Referring now to FIG. 3, there is shown a later step in which the three types of transistors have had their gate oxides and the thin (=10 nm) thermal oxide sidewalls formed. The notation for reference numerals used here is that corresponding elements of the transistors differ by 100, 200 and 300 as the case may be. For the standard N-FET on the left, a gate 120 has been formed over gate oxide 135 and conventional oxidized sidewalls 122 and 124 have been formed in previous processing steps. A low doped drain (LDD) is being formed in this figure, to implant low doped areas 132 and 134 of transistor 100. Simultaneously, a high current P-FET would receive the same implant dose if an N$^-$ substrate were used. The implant dose level is a conventional dose of $2 \times 10^{13}/cm^2$ @20 KeV, producing a peak concentration of $8 \times 10^{17}/cm^3$ (phosphorous).

Figure 4:
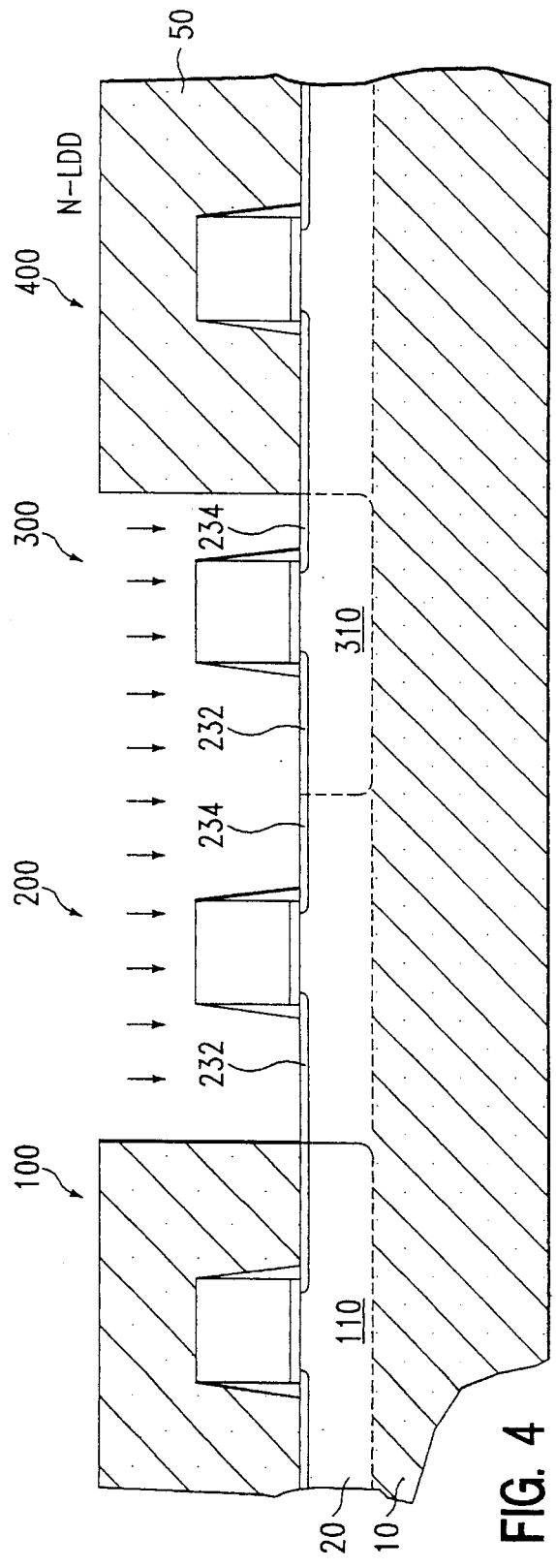

Referring now to FIG. 4, there is shown the corresponding low doped drain implant for the high current N-FET and the standard P-FET. The implant dose level is typically a conventional dose of $2 \times 10^{13}/cm^2$ @20 KeV and a peak concentration of $8 \times 10^{17}/cm^3$ (boron). As can be seen, the high current N-FET and the standard P-FET receive the same low doped drain dose.

Following the LDD implants (P-type for the high current NFET and standard PFET and N-type for the standard NFET—optionally N-type for a high-current PFET if an N$^-$ substrate were used) a thicker spacer is formed over the existing thin oxidized spacer 122, 124. This second spacer, referred to as the source (or drain) spacer, is typically 40 nm of nitride, etched anisotropically to form the spacer. The higher dose implants for the source and drain are then performed (N$^+$ for all NFETs, P$^+$ for all PFETs). In the illustrative example, a dose of $5.0 \times 10^{15}/cm^2$ @25 KeV of arsenic was used. The 40 nm separation between the LDD dose and the high dose implants maintains a separation between the two implants even after diffusion.

Figure 5:
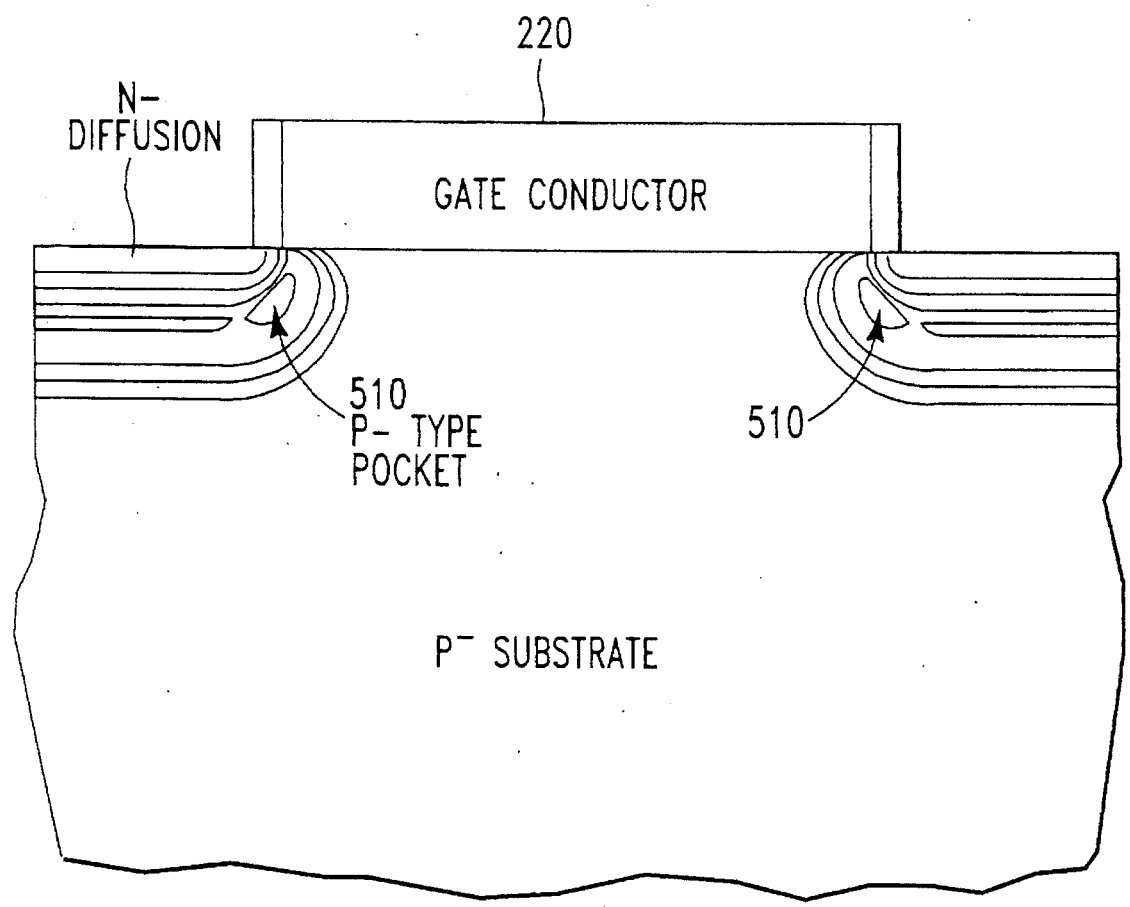
FIG. 5 illustrates diffusion into the channel of the high-current NFETs.

The remainder of the processing to form the conventional sources and drains, and interconnection to form the remainder of the circuit are conventional and are omitted from the drawing for simplicity. Box 3 in FIG. 3 indicates schematically the remainder of the circuit being constructed. At the end of the process, following all heat treatments, the modelled doping distribution for the high current NFET appears as shown in FIG. 5. Note that the boron has diffused into the channel in a region that is referred to as a halo and the formation of the slightly buried p-type pockets 510 for the high performance NFET shown.

The slightly buried P-type pockets serve to suppress punchthrough, allowing a very lightly doped substrate to be used. Without the P-pockets, the device would punch through at all but the very longest channel lengths (>10 μm). The P-type pockets do not significantly affect $V_t$, except a very short channels (<0.35 μm). Even at short channels, the $V_t$ is at least 200 mV less than the $V_t$ of the standard NFET. This is a very significant advantage compared to the standard NFET, in an application such as sense amplifiers requiring low $V_t$ in a DRAM application.

The threshold of the high current FETs is set by diffusion of the LDD implants, since the dopant level of epitaxial layer 20 is an order of magnitude less than the level set by a conventional threshold implant. Those skilled in the art will readily be able to combine annealing temperatures and times with dopant levels to produce a desired threshold.

It has been found that the high current FETs are resistant to threshold rolloff with gate length, since the P-pockets are effective for suppressing drain induced barrier lowering and that $V_t$ is less sensitive to changes in the source to substrate voltage for a high current FET compared with that for a standard device as a result of the lightly doped region.

Figure 7:
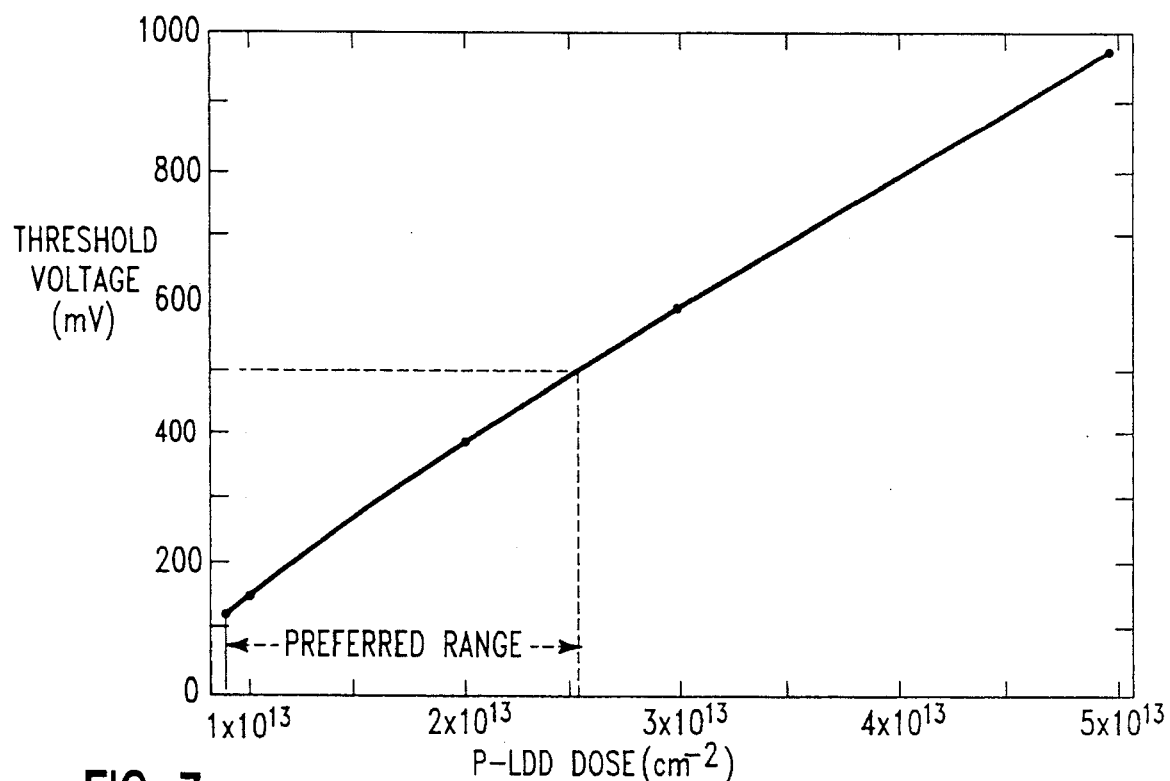
FIG. 7 illustrates the dependence of threshold voltage on LDD dose.
Figure 6:
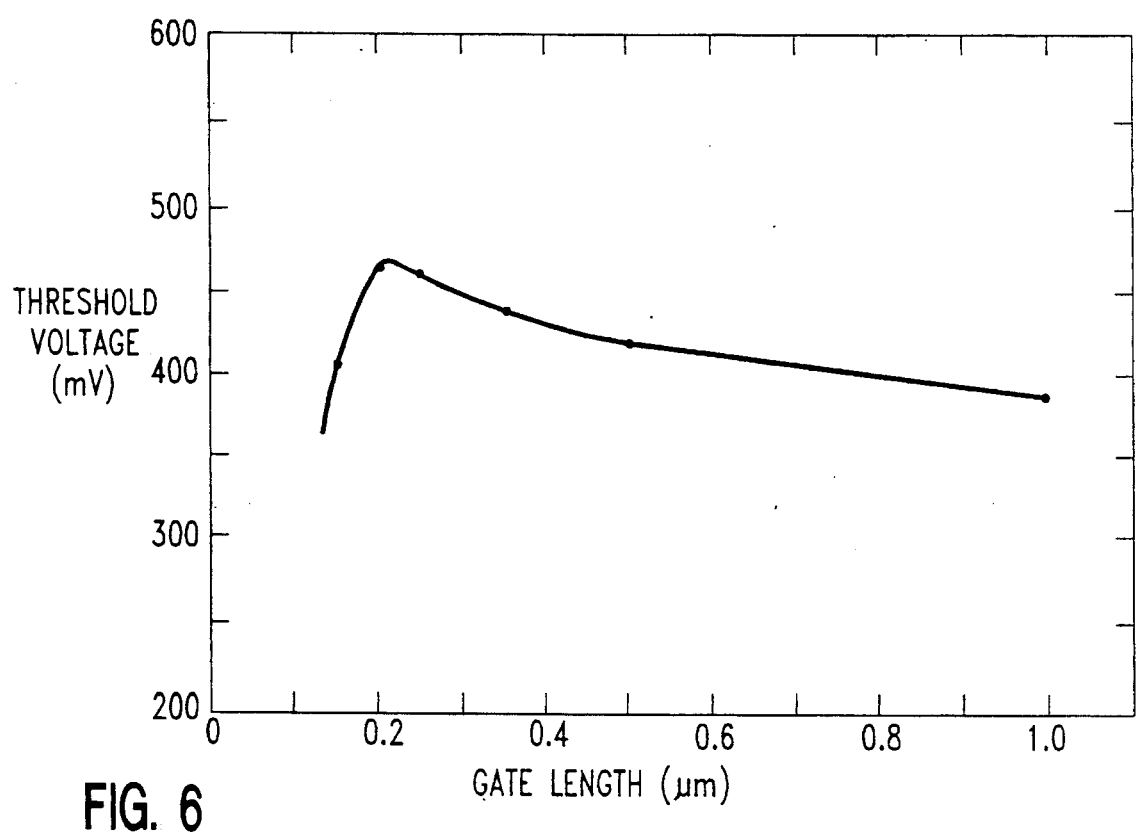
FIG. 6 illustrates the dependence of threshold voltage on gate length.

Referring now to FIG. 6, there is shown the modelled dependence of threshold voltage on gate length (for a P-LDD dose of $2\times10^{13}/cm^2$ @20 KeV of boron, $V_{DS}$ of 3.5 V and $V_{SX}$ of 0.0 V. It can be seen that the threshold is not a sensitive function of gate length above 0.25 μm. FIG. 7 illustrates the flexibility of setting the gate threshold afforded by the invention, for a gate length of 1.0 μm, the voltage being the same as FIG. 6.

The same sequence of Figures can be used to describe an alternate embodiment of the invention, now disregarding the high current NFET 200 and substituting the high current PFET 400. In this version, layer 20 is now doped N⁻. FIG. 3 now shows the high-current PFET 400 being implanted with its LDD implant at the same time as the standard NFET.

Yet another version of the invention is indicated schematically in FIG. 2, showing counterdoped N-well 410', which may be formed in a separate implant step from that shown in FIG. 2 or in the same step, depending on the initial concentration of layer 20 and the desired threshold of the high-current PFET. In this case, the implant for well 410' is intended to counterdope the initial doping P⁻ level to provide a net dopant concentration that is on the order of the $1\times10^{16}/cm^3$ that was employed in the illustrative embodiment. The provision of an extra doping step increases the process complexity, of course, and the use of this embodiment will depend on the usual technical and economic tradeoffs.

Those skilled in the art will readily be able to adjust doping levels, voltages and the like in accordance with their own circumstances, so that different embodiments of the invention may be made in view of the enclosed teaching. The following claims are not meant to be limited to the embodiments disclosed.

We claim:

1. A method of making an integrated circuit containing standard NFETs and PFETs and high current NFETs in NFET sites and PFET sites in a CMOS process using a P-type substrate comprising the steps of:

preparing a P⁻ substrate;

forming a blocking mask for blocking both PFET sites and high current NFET sites in said substrate implanting P-wells for said standard NFETs in a subset of said NFET sites, whereby said high current NFET has no P well;

forming gates above said NFET and PFET sites;

implanting an N-LDD dose for said standard NFET while said high current NFET sites are blocked;

simultaneously implanting said high current NFET and standard PFET with a P-LDD dose of boron;

implanting both the standard NFETs and PFETs and the high current NFET with a source and drain implant;

annealing the wafer, whereby the boron out-diffuses into the channel of the high current FET to form a boron halo that reduces punch-through; and completing said integrated circuit.

2. A method according to claim 1, in which said step of implanting said P-LDD dose is preceded by a step of forming a first sidewall on said gates and said step of implanting said source and drain implant is preceded by forming a source sidewall thicker than said first sidewall.

3. A method of making an integrated circuit containing standard PFETs and NFETs and high current PFETs in PFET sites and NFET sites in a CMOS process using an N-type substrate comprising the steps of:

preparing a substrate;

forming a blocking mask for blocking both NFET sites and high current PFET sites in said substrate implanting N-wells for said standard PFETs in said PFET sites, whereby said high current PFET has no N well;

forming gates above said PFET and NFET sites;

implanting a P-LDD dose for said standard PFET while said high current PFET sites are blocked;

implanting said high current PFET and standard NFET with an N LDD dose;

implanting both the standard PFET and the high current PFET with a P⁺ source and drain implant;

annealing the wafer, whereby said N-LDD dose out-diffuses into the channel of the high current PFET to form a halo that reduces punch-through; and completing said integrated circuit.

4. A method according to claim 3, in which said step of implanting said N-LDD dose is preceded by a step of forming a first sidewall on said gates and said step of implanting said source and drain implant is preceded by forming a source sidewall thicker than said first sidewall.

5. A method of making an integrated circuit containing standard PFETs and NFETs and high current NFETs and PFETs in NFET sites and PFET sites in a CMOS process using a P⁻ substrate comprising the steps of:

preparing a P⁻ substrate;

forming a blocking mask for blocking both NFET sites and high current PFET sites in said substrate implanting N-wells for said standard PFETs in a first subset of said PFET sites, whereby said high current PFET has no N well;

implanting counterdoped wells in a second subset of said PFET sites to produce a net N⁻ doping concentration for high current PFET sites;

forming gates above said PFET and NFET sites;

implanting a P-LDD dose for said high current NFET and standard PFET while said high current PFET sites and standard NFET sites are blocked;

implanting an N-LDD dose for said high current PFET and standard NFET while said high current NFET sites and standard PFET sites are blocked;

implanting both the standard PFETs and NFETs and the high current PFETs and NFETs with source and drain implants;

annealing the wafer, whereby said N-LDD dose out-diffuses into the channel of the high current PFET to form a halo that reduces punch-through; and completing said integrated circuit.

6. A method of making an integrated circuit containing standard PFETs and NFETs and high current NFEts and PFETs in NFET sites and PFET sites in a CMOS process using an N⁻ substrate comprising the steps of:

preparing an N⁻ substrate;

forming a blocking mask for blocking both PFET sites and high current NFET sites in said substrate;

implanting P-wells for said standard NFETs in a first subset of said NFET sites, whereby said high current NFET has no P well;

implanting counterdoped wells in a second subset of said NFET sites to produce a net P⁻ doping concentration for high current NFET sites;

forming gates above said NFET and PFET sites;

implanting an N-LDD dose for said high current PFET and standard NFET while said high current NFET sites and standard PFET sites are blocked;

implanting a P-LDD dose for said high current NFET and standard PFET while said high current PFET sites and standard NFET sites are blocked;

implanting both the standard NFETs and PFETs and the high current NFETs and PFETs with source and drain implants;

annealing the wafer, whereby said P-LDD dose out-diffuses into the channel of the high current NFET to form a halo that reduces punch-through; and completing said integrated circuit.

* * * * *